(12) United States Patent
Quitoriano et al.

(10) Patent No.: US 8,878,342 B2
(45) Date of Patent: Nov. 4, 2014

(54) USING ALLOY ELECTRODES TO DOPE MEMRISTORS

(75) Inventors: Nathaniel J. Quitoriano, Pacifica, CA (US); Douglas Ohlberg, Mountain View, CA (US); Philip J. Kuekes, Menlo Park, CA (US); Jianhua Yang, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 537 days.

(21) Appl. No.: 13/130,801

(22) PCT Filed: Jan. 26, 2009

(86) PCT No.: PCT/US2009/000517
§ 371 (c)(1),
(2), (4) Date: May 24, 2011

(87) PCT Pub. No.: WO2010/085226
PCT Pub. Date: Jul. 29, 2010

(65) Prior Publication Data
US 2011/0221027 A1   Sep. 15, 2011

(51) Int. Cl.
*H01L 29/02* (2006.01)
*H01L 29/00* (2006.01)
(Continued)

(52) U.S. Cl.
CPC ........ *H01L 27/1021* (2013.01); *H01L 27/2463* (2013.01); *H01L 21/26506* (2013.01);
(Continued)

(58) Field of Classification Search
CPC ....... H01L 45/146; H01L 45/12; H01L 45/04; H01L 45/1233; H01L 45/1675; H01L 45/08; H01L 45/085; H01L 45/1266; H01L 45/141; H01L 45/142; H01L 45/143; H01L 45/144; H01L 45/145; H01L 45/147; H01L 45/1641; H01L 27/2436; H01L 27/2454; H01L 27/2463
USPC .................. 977/762; 438/382, 381, 385, 104; 365/148, 51, 63, 151, 161, 163, 158, 365/171, 175
See application file for complete search history.

(56) References Cited

U.S. PATENT DOCUMENTS 7,426,128 B2 * 9/2008 Scheuerlein ..................... 365/63
2005/0237834 A1 * 10/2005 Bozano et al. ................. 365/203
(Continued)

FOREIGN PATENT DOCUMENTS

WO   WO 2010014064 A1 * 2/2010   ............ H01L 29/861

OTHER PUBLICATIONS

International Search Report, Sep. 25, 2009, PCT Patent Application No. PCT/US2009/000517.

*Primary Examiner* — Wensing Kuo
*Assistant Examiner* — Moazzam Hossain

(57) ABSTRACT

Various embodiments of the present invention are direct to nanoscale, reconfigurable, memristor devices. In one aspect, a memristor device comprises an electrode (301,303) and an alloy electrode (502,602). The device also includes an active region (510,610) sandwiched between the electrode and the alloy electrode. The alloy electrode forms dopants in a sub-region of the active region adjacent to the alloy electrode. The active region can be operated by selectively positioning the dopants within the active region to control the flow of charge carriers between the electrode and the alloy electrode.

18 Claims, 9 Drawing Sheets

(51) Int. Cl.
*H01L 21/20* (2006.01)
*G11C 11/00* (2006.01)
*H01L 27/24* (2006.01)
*H01L 45/00* (2006.01)
*H01L 27/102* (2006.01)
*B82Y 10/00* (2011.01)
*H01L 21/265* (2006.01)

(52) U.S. Cl.
CPC ............ *H01L 45/142* (2013.01); *H01L 45/146* (2013.01); *H01L 45/14* (2013.01); *H01L 45/147* (2013.01); *H01L 45/08* (2013.01); *H01L 45/1233* (2013.01); *H01L 45/1253* (2013.01); *H01L 45/145* (2013.01); *H01L 45/149* (2013.01); *H01L 45/148* (2013.01); *B82Y 10/00* (2013.01); *Y10S 977/762* (2013.01)

USPC ...... 257/536; 257/2; 257/E29.148; 257/E21.363; 257/E27.047; 257/E25.014; 365/148; 365/51; 365/63; 438/382; 438/385; 977/762

(56) References Cited

U.S. PATENT DOCUMENTS

| | | | |
|---|---|---|---|
| 2007/0269683 A1* | 11/2007 | Chen et al. | 428/697 |
| 2008/0001172 A1* | 1/2008 | Karg et al. | 257/194 |
| 2008/0078985 A1* | 4/2008 | Meyer et al. | 257/6 |
| 2008/0090337 A1 | 4/2008 | Williams | |
| 2008/0142925 A1 | 6/2008 | Bednorz et al. | |
| 2009/0027976 A1* | 1/2009 | Brewer et al. | 365/189.14 |
| 2009/0108202 A1* | 4/2009 | Gritz et al. | 250/338.1 |
| 2009/0180314 A1* | 7/2009 | Liu | 365/163 |
| 2009/0272959 A1* | 11/2009 | Phatak et al. | 257/2 |
| 2010/0038791 A1* | 2/2010 | Lee et al. | 257/758 |
| 2011/0228593 A1* | 9/2011 | Strukov | 365/148 |
| 2012/0074372 A1* | 3/2012 | Yang et al. | 257/4 |

* cited by examiner

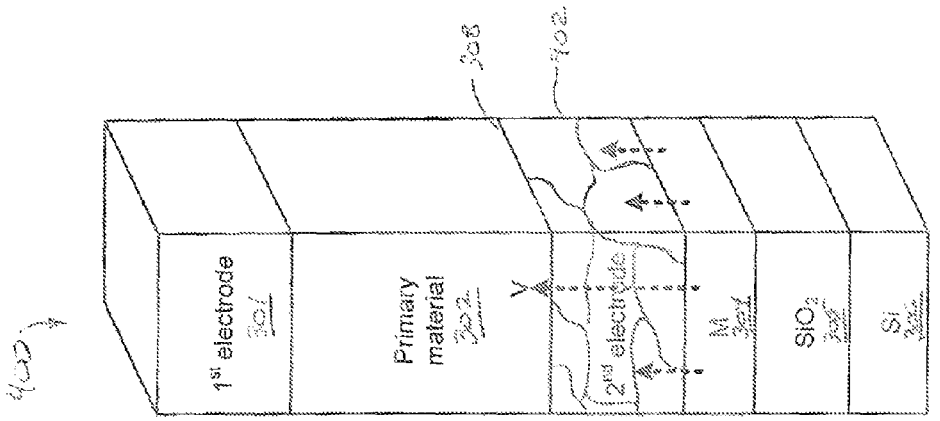
Figure 4
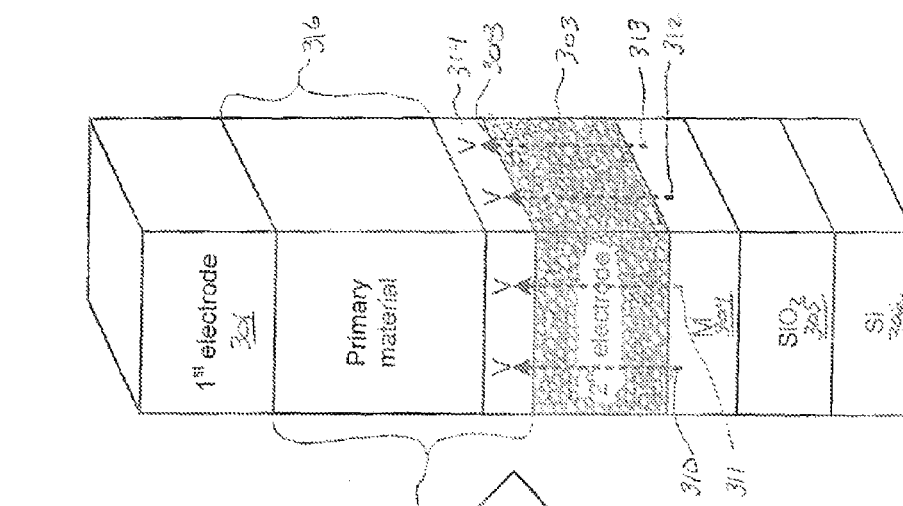
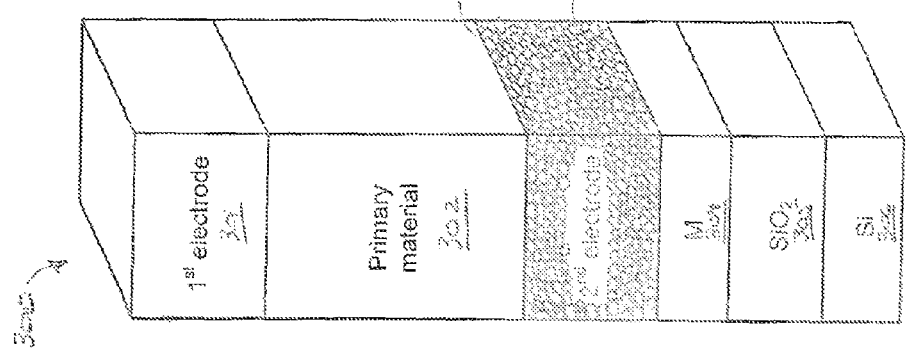
Figure 3

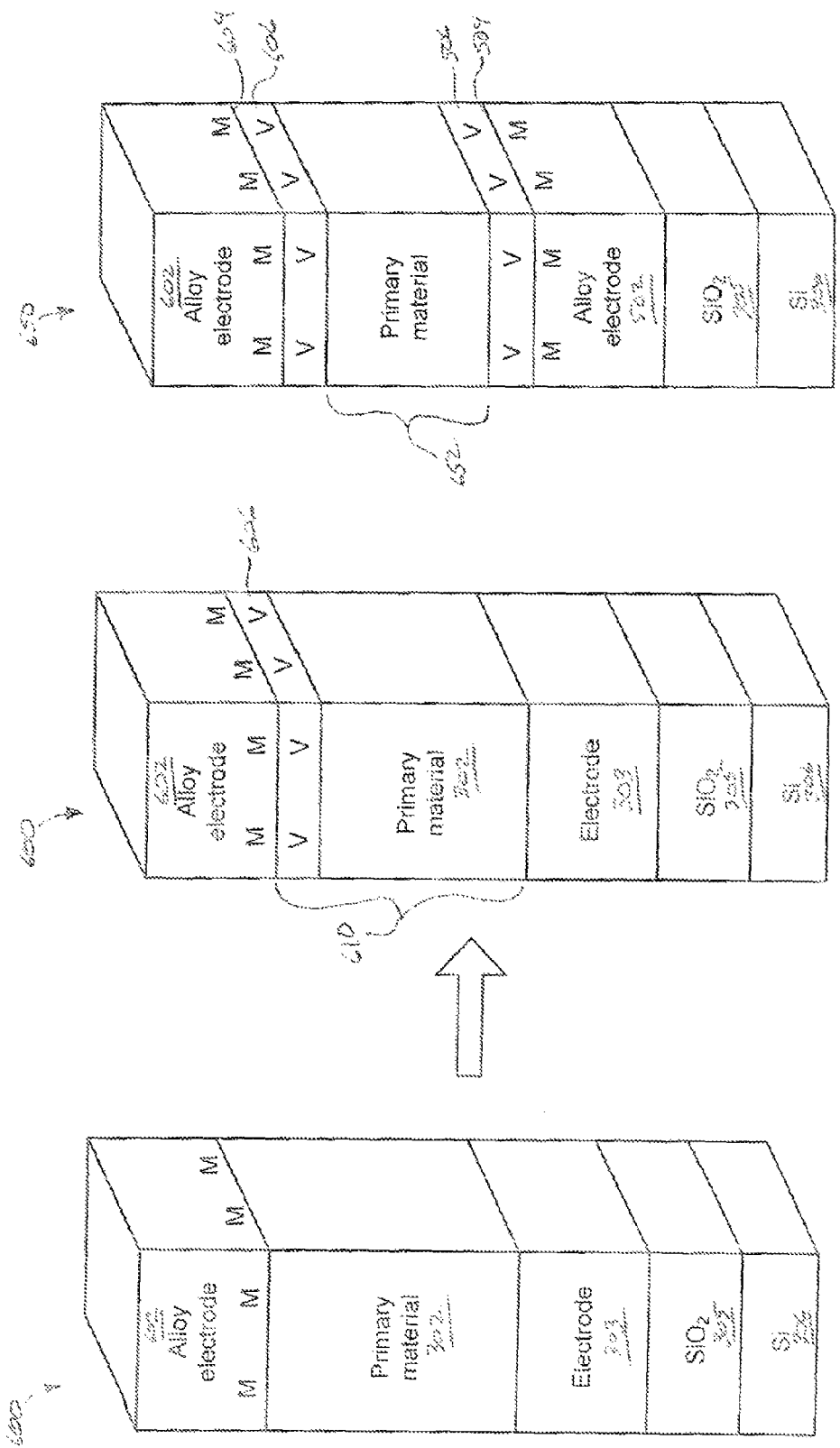

US 8,878,342 B2

USING ALLOY ELECTRODES TO DOPE MEMRISTORS

RELATED APPLICATION

The present application claims the benefit of priority PCT/US2009/000517, filed 26 Jan. 2009, herein incorporated by reference in its entirety.

TECHNICAL FIELD

Embodiments of the present invention are related to nanoscale memristor devices, and, in particular, to memristors having at least one alloy electrode to dope memristor devices.

BACKGROUND

Significant research and development efforts are currently directed towards designing and manufacturing nanoscale electronic devices, such as nanoscale memories. Nanoscale electronics promises significant advances, including significantly reduced features sizes and the potential for self-assembly and for other relatively inexpensive, non-photolithography-based fabrication methods. However, the design and manufacture of nanoscale electronic devices present many new problems compared with the current state-of-the-art.

Studies of switching in nanometer-scale transition-metal devices have previously reported that these devices could be reversibly switched and had an "on-to-off" conductance ratio of ~$10^3$. These devices have been used to construct crossbar circuits and provide a promising route for the creation of ultra-high density non-volatile memory. A series connection of crossbar switches that can be used to fabricate, for example, latch circuit elements has also been demonstrated, which is an important component for logic circuits and for communication between logic and memory. New logic families that can be constructed entirely from crossbar arrays of resistive switches or as hybrid structures composed of resistive switches and transistors have been described. These new logic families have the potential to dramatically increase the computing efficiency of CMOS circuits, thereby enabling performance improvements of orders of magnitude without having to shrink transistors, or to even replace CMOS for some applications if necessary. However, it is desired to improve the performance of the devices that are presently fabricated.

BRIEF DESCRIPTION OF THE DRAWINGS

FIG. 3 shows layers and formation of an ideal memristor device.

FIG. 4 shows enlarged grains comprising a second electrode of a second device.

FIG. 6A shows a second memristor device configured in accordance with embodiments of the present invention.

FIG. 6B shows a third memristor device configured in accordance with embodiments of the present invention.

DETAILED DESCRIPTION

Various embodiments of the present invention are directed to nanoscale, electronic devices, which are nonvolatile and combine reconfigurable diode rectifying states with memristive switching. A memristor device configured in accordance with embodiments of the present invention is composed of an active region sandwiched between two electrodes. The two interfaces between the active region and the electrodes are Schottky-like contacts. This multilayered junction is a diode that can be switched into one of four different rectifying states by applying an electrical field of an appropriate magnitude and polarity across the active region. The electric field changes the electrostatic potential distribution near the interfaces to have Ohmic-like barriers and/or Schottky-like barriers, thus enabling the active region to be re-configured so the device can operate as one of the following four types of rectifiers: a forward rectifier, a reverse rectifier, a shunted rectifier, and a head-to-head rectifier. The active region remains in a particular rectifying state provided operating voltages applied to the device do not exceed the magnitude of the electric field used to switch the rectifying state of the active region.

The active region is likely operated by positioning and repositioning dopants within the active region. The dopants are formed in the active region via chemical agents that thermally diffuse through one of the electrodes to an interface between the electrode and the active region. However, the grains comprising the electrode can be too large to allow a sufficient amount of agents to reach the interface. As a result, dopants fail to form in sufficient concentrations. In addition, the amount and distribution of the formed dopants are random and difficult to control. Embodiments of the present invention are directed to forming alloy electrodes including the dopants or the agents that form dopants in sufficient concentrations and controllable distributions at the interface between the active region and the alloy electrode.

The detailed description is organized as follows: A description of electronically actuated devices is provided in a first subsection. A description of switching the rectifying state of the devices is provided in a second subsection. Various materials that can be used to fabricate the devices are provided in a third subsection. An example implementation of the devices in crossbar arrays is provided in a fourth subsection.

I. An Electronically Actuated Device

Figure 1A:
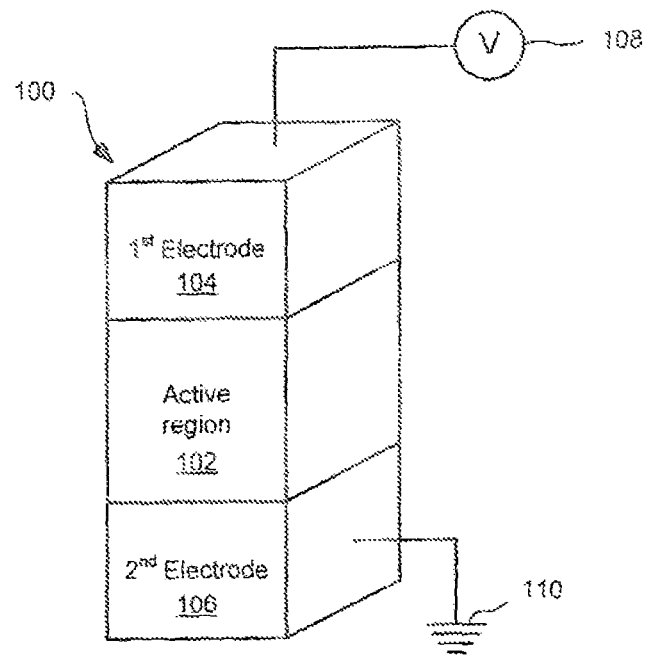
FIG. 1A shows a memristor device configured in accordance with embodiments of the present invention.

FIG. 1A shows a memristive device 100 configured in accordance with embodiments of the present invention. The device 100 is composed of three layers: an active region 102 sandwiched between a first electrode 104 and a second electrode 106. The first electrode 104 is connected to a voltage source 108 and the second electrode is connected to a ground 110. The active region 102 is a diode that includes a dopant. Applying an electric field of an appropriate magnitude and polarity changes the position of the dopant. As a result, the active region 102 can be operated as one of the four different types of rectifiers: a forward rectifier, a reverse rectifier, a head-to-head rectifier, and a shunted rectifier.

Figure 1B:
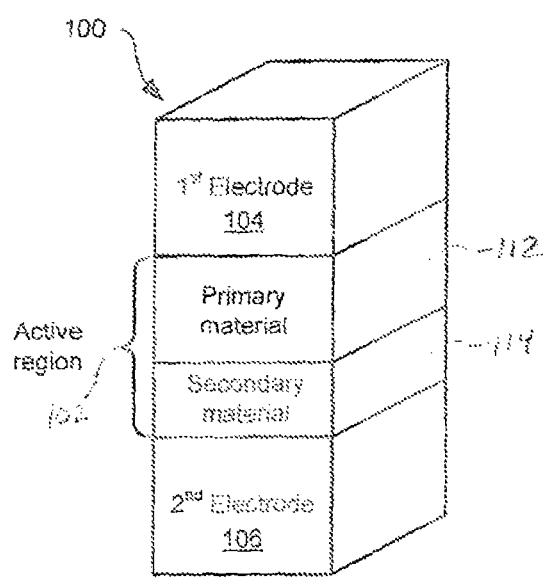
FIG. 1B shows primary and secondary active material layers in an active region of a memristor device configured in accordance with embodiments of the present invention.

FIG. 1B shows the active region 102 is composed of a primary active region or layer 112, and a secondary active region or layer 114 in accordance with embodiments of the present invention. The primary active layer 112 comprises a thin film of a material that is electronically semiconducting or nominally electronically insulating and can also be a weak ionic conductor. The primary active material is capable of transporting and hosting ions that act as dopants in order to control the flow of electrons or current through the device 100. On the other hand, the secondary active material comprising the secondary active layer 114 typically comprises a film within the active region that is a source of dopants for the primary active material. These dopants may be impurity atoms such as hydrogen or some other cation, such as alkali or transition metals, that acts as electron donors for the primary active material. Alternatively, the dopants can be anion vacancies, which in the primary active material are charged and therefore are also electron donors for the lattice of the active region 102. It is also possible to drive the anions into the primary active material, which become electron acceptors or hole donors.

The basic mode of operation is to apply an electrical field of an appropriate magnitude and polarity across the active region 102. When the magnitude and polarity of the electrical field, also called a "drift field," exceeds a threshold, the dopants become mobile in the primary active material, and the dopants can drift into or out of the primary active material via ionic transport from the secondary material. The ionic species are specifically chosen from those that act as electrical dopants for the primary active material, and thereby change the resistance of the primary active material. For example, applying a drift field that introduces dopants from the secondary active material into the primary active material lowers the resistance of the primary active material, while applying a drift field that drives dopants from the primary active material into the secondary active material increases the resistance of the primary active material. In addition, the primary active material and the dopants are chosen such that the drift of the dopants into or out of the primary active material is possible but not too facile that dopants can diffuse into or out of the primary active material when no voltage is applied. Some diffusion resistance is required to ensure that the active region 102 remains in a particular rectifying state for a reasonable period of time, perhaps for many years, at room temperature. This ensures that the active region 102 is nonvolatile because the active region 102 retains its rectifying state even after the drift field has been removed. Applying a drift field with a large enough magnitude causes both electron current and dopants to drift, whereas applying operating voltages with lower relative voltage magnitudes than the drift field causes negligible dopant drift enabling the device to retain its rectifying state during operation.

The device 100 is a memristor because the resistance changes in a non-volatile fashion depending on the amount and distribution of charge in the device. Memristance is a non-volatile, charge-dependent resistance denoted by m(q). The term "memristor" is short for "memory resistor." Memristors are a class of passive circuit elements that maintain a functional relationship between the time integrals of current and voltage. This results in resistance varying according to the device's memristance function. Specifically engineered memristors provide controllable resistance useful for switching current. The definition of the memristor is based solely on fundamental circuit variables, similar to the resistor, capacitor, and inductor. Unlike those more familiar elements, the necessarily nonlinear memristors may be described by any of a variety of time-varying functions. As a result, memristors do not belong to Linear, Time-Independent, circuit models. A linear, time-independent memristor is simply a conventional resistor.

A memristor is a element in which the 'magnetic flux' (defined as an integral of bias voltage over time) $\Phi$ between the terminals is a function of the amount of electric charge q that has passed through the device. Each memristor is characterized by its memristance function describing the charge-dependent rate of change of flux with charge as follows:

$$m(q) = \frac{d\Phi}{dq}$$

Based on Faraday's law of induction that magnetic flux $\Phi$ is the time integral of voltage, and charge q is the time integral of current, the memristance can be written as $$m(q) = \frac{V}{I}$$

Thus, as stated above, the memristance is simply nonvolatile charge-dependent resistance. When m(q) is constant, the memristance reduces to Ohm's Law R=V/I. When m(q) is not constant, the equation is not equivalent to Ohm's Law because q and m(q) can vary with time. Solving for voltage as a function of time gives:

$$V(t)=m[q(t)]I(t)$$

This equation reveals that memristance defines a linear relationship between current and voltage, as long as charge does not vary. However, nonzero current implies instantaneously varying charge. Alternating current may reveal the linear dependence in circuit operation by inducing a measurable voltage without net charge movement, as long as the maximum change in q does not cause change in m. Furthermore, the memristor is static when no current is applied. When I(t) and V(t) are 0, m(t) is constant. This is the essence of the memory effect.

The primary active layer 112 can be single crystalline, poly crystalline, nanocrystalline, nanoporous, or amorphous. The mobility of the dopants in nanocrystalline, nanoporous or amorphous materials, however, is much higher than in bulk crystalline material, since drift can occur through grain boundaries or through local structural imperfections in a nanocrystalline, nanoporous, or amorphous material. Also, because the primary active material is relatively thin, the amount of time needed for dopants to drift into or out of the primary active material enables the primary active materials conductivity to be rapidly changed. For example, the time needed for a drift process varies as the square of the distance covered, so the time to drift one nanometer is one-millionth the time to drift one micrometer.

The primary active layer 112 and the secondary active layer 114 of the active region 102 are contacted on either side by metal electrodes 104 and 106, or one of the electrodes can be composed of a semiconductor material and the other a metal. When the active region 102 is composed of a semiconductor material, the contact between a metal electrode and the active region 102 depletes the active region 102 of free charge carriers. Thus, the net charge of the active region 102 depends on the identity of the dopant and is positive in the case of electron donors and negative in the case of electron acceptors.

The ability of the dopant to drift in and out of the primary active material is substantially improved if one of the interfaces connecting the active region 102 to a metal or semiconductor electrode is non-covalently bonded. Such an interface may be composed of a material that does not form covalent bonds with the electrode, the primary active material, or both. This non-covalently bonded interface lowers the activation energy of the atomic rearrangements that are needed for drift of the dopants in the primary active material. This interface is essentially an extremely thin insulator, and adds very little to the total series resistance of the device.

One potentially useful property of the primary active material is that it can be weak ionic conductor. The definition of a weak ionic conductor depends on the application for which the device 100 is designed. The mobility $\mu_d$ and the diffusion constant D for a dopant in a lattice are related by the Einstein equation:

$$D = \mu_d kT$$

where k is Boltzmann's constant, and T is absolute temperature. Thus, if the mobility $\mu_d$ of a dopant in a lattice is high then so is the diffusion constant. D. In general, it is desired for the active region 102 of the device 100 to maintain a particular rectifying state for an amount of time that may range from a fraction of a second to years, depending on the application. Thus, it is desired that the diffusion constant D be low enough to ensure a desired level of stability, in order to avoid inadvertently turning the active region 102 from one rectifier to another rectifier via ionized dopant diffusion, rather than by intentionally setting the state of the active region 102 with an appropriate voltage. Therefore, a weakly ionic conductor is one in which the dopant mobility $\mu_d$ and the diffusion constant D are small enough to ensure the stability or non-volatility of the active region 102 for as long as necessary under the desired conditions. On the other hand, strongly ionic conductors would have relatively larger dopant mobilities and be unstable against diffusion.

II. Non-Volatile Memristive Switching of the Device

In certain embodiments, the active region 102 can be operated so that Ohmic and Shottky barriers are created to control the flow of charge carriers through the active region 102. However, the traditional description of electrode/semiconductor Schottky and Ohmic barriers does not apply to a nanoscale device 100 because the materials comprising the electrodes 104 and 106 and the active region 102 are structured at the nanoscale. As a result, the structural and electronic properties are not averaged over the large distances for which the theory of metal-semiconductor contacts are developed. Instead, the electronic properties of undoped electrode/active region interfaces can electronically resemble Schottky barriers and are called "Schottky-like barriers," and the electronic properties of doped electrode/semiconductor interfaces electronically resemble Ohmic barriers and are called "Ohmic-like barriers."

Figure 2A:
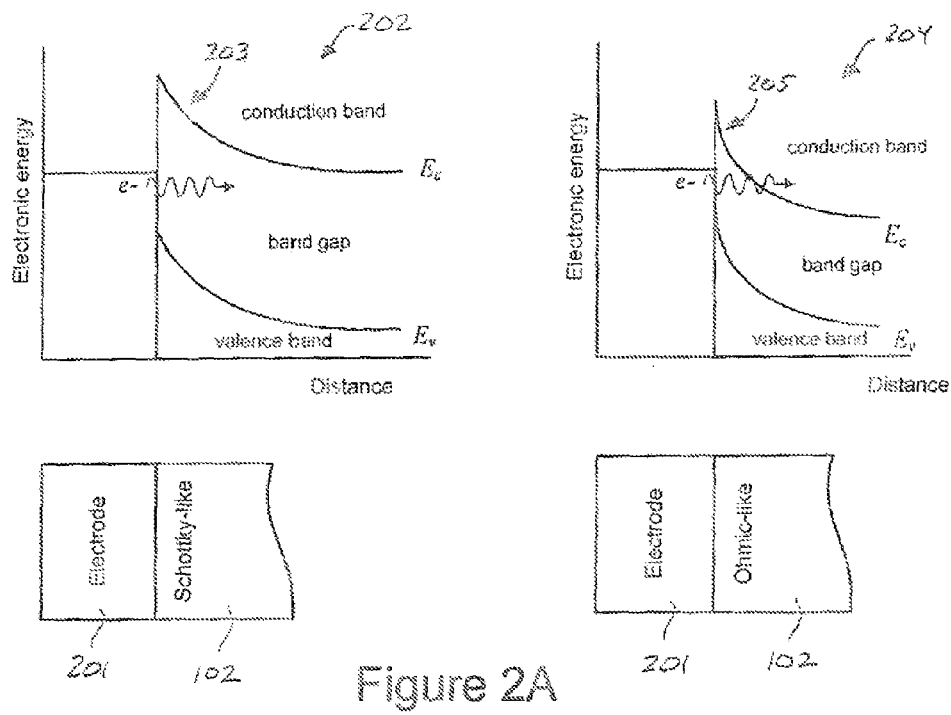
FIG. 2A shows electronic band diagrams representing electronic properties of Schottkly-like and Ohmic-like barriers at an electrode and active region interface in accordance with embodiments, of the present invention.

Conduction of electrons through the active region 102 occurs via quantum mechanical tunneling through the Ohmic-like barrier. FIG. 2A shows electronic band diagrams that represent the electronic properties of Schottky-like and Ohmic-like barriers at an electrode 201/active region 102 interface in accordance with embodiments of the present invention. As shown in band diagram 202, when the active region 102 near an electrode 201 has a low dopant concentration or is essentially intrinsic, the tunneling barrier is a Schottky-like barrier 203, which can be characterized as high and wide and electrons cannot tunnel into the conduction band of the active region 102. Thus, the conductivity through the active region 102 is low and the device 100 is in the "off" state. On the other hand, as shown in band diagram 204, when a sufficient number of dopants have been moved into the active region 102 near one of the electrodes 201, the tunneling barrier is an Ohmic-like barrier 205 and the width and perhaps the height of the tunneling barrier are dimished, electrons tunnel into the conduction band of the active region 102, which results in an increase in the conductivity, and the device 100 is in the "on" state.

Figure 2B:
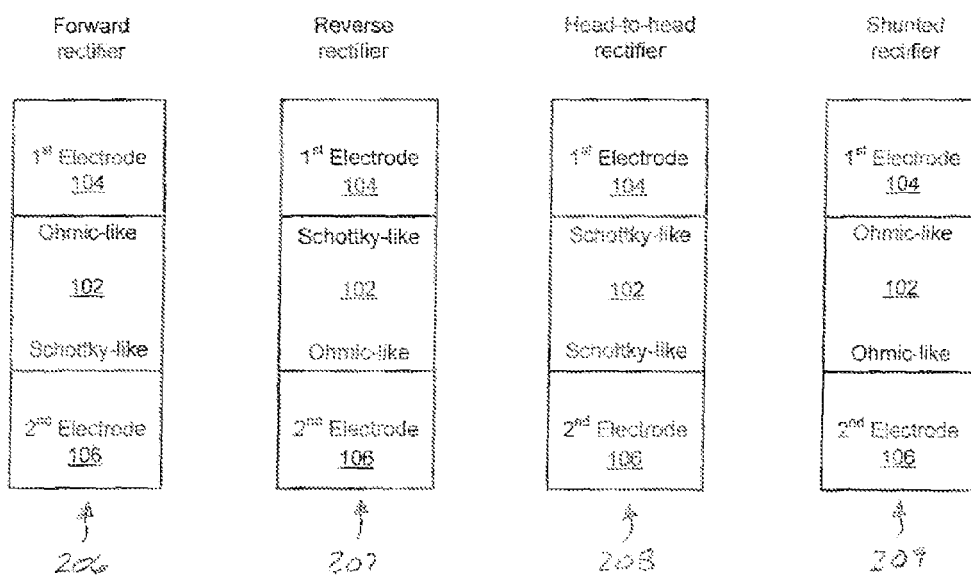
FIG. 2B shows profiles of tunneling barriers associated with four rectifiers configured in accordance with embodiments of the present invention.

Each of the four rectifiers corresponds to a different dopant distribution. When the dopant is located at or near an electrode/active region interface, the interface has an Ohmic-like barrier. Thus, charge carriers can readily tunnel through the Ohmic-like barrier into and out of the active region 102. On the other hand, an undoped portion of the active region 102 at or near an electrode/active region interface has a Schottky-like barrier that is either too high or wide to permit most charge carriers from tunneling through the active region 102. FIG. 2B shows the relative locations of the Ohmic-like and Schottky-like barriers associated with each of the four rectifiers in accordance with embodiments of the present invention. A forward rectifier 206 and a reverse rectifier 207 have Ohmic-like barriers and Schottky-like barriers located at opposite interfaces. A head-to-head rectifier 208 is characterized by having the dopants distributed within the active region 102 leaving Schottky-like barriers at both interfaces. On the other hand, a shunted rectifier 209 is characterized by having dopants located at or near both interfaces creating Ohmic-like barriers at both interfaces.

Figure 2C:
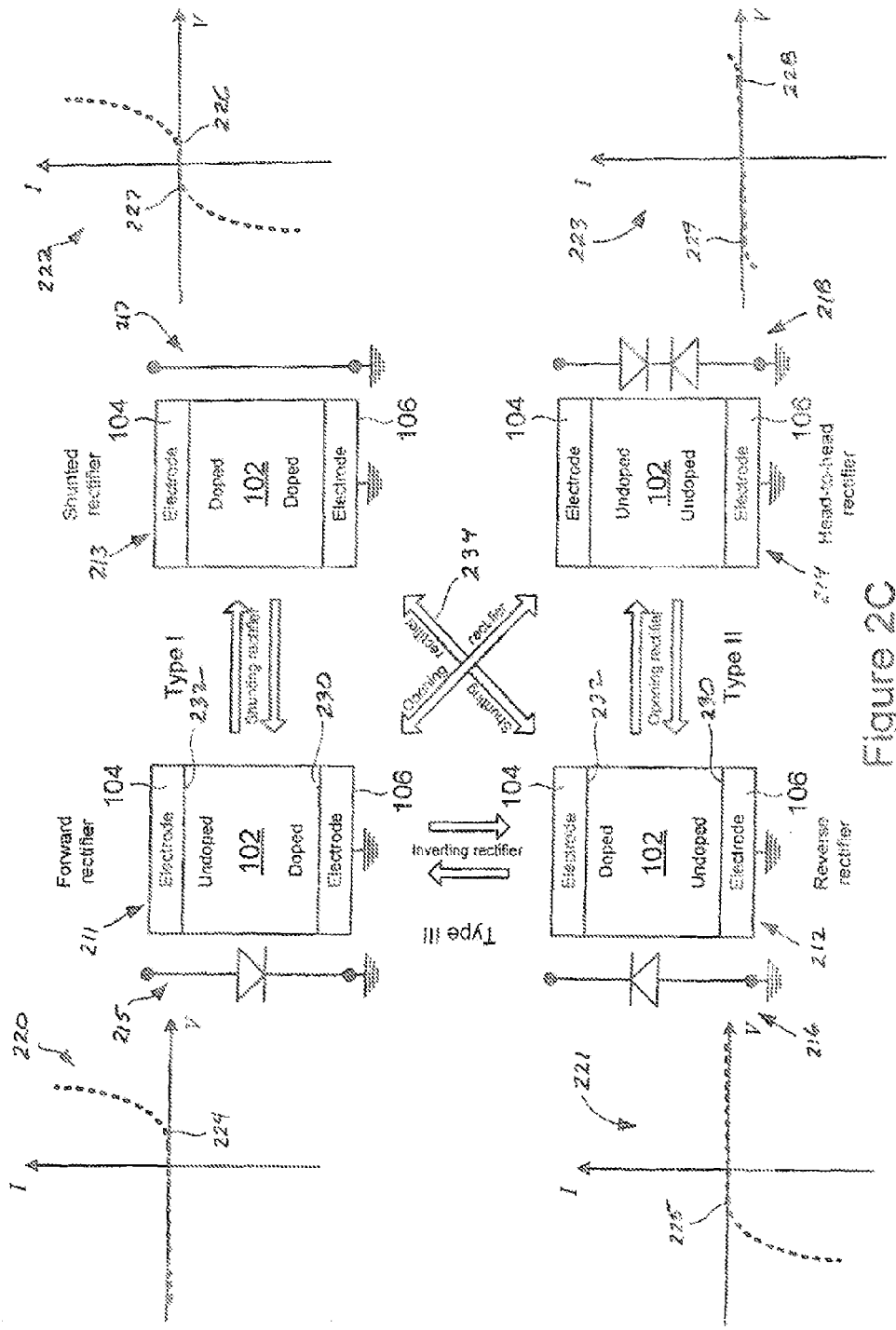
FIG. 2C shows plots of current-versus-voltage curves associated with the four rectifiers shown in FIG. 2B and three modes of switching between pairs of the rectifiers in accordance with embodiments of the present invention.

FIG. 2C shows schematic profiles of the four rectifiers 211-214 of the active region 102 and three modes of switching between pairs of rectifiers in accordance with embodiments of the present invention. In addition to the four rectifiers 211-214, FIG. 2C includes circuit diagrams 215-218 and I-V characteristic plots 220-223 that are associated with each of the four rectifiers 211-214. Each of the four rectifiers 211-214 of the device 100 represents a different profile distribution of dopants, and therefore, has a different associated I-V characteristic represented in each of the plots 220-223. Electrode/active region contacts are typically Ohmic-like in the case of heavy doping, and rectifying or Schottky-like in the case of low doping. Thus, the concentration of dopants at an interface determines the electronic behavior, and therefore, the transport of charge carriers through the active region 102. The four different rectifiers 211-214 are identified as a forward rectifier, a reverse rectifier, a shunted rectifier, and a head-to-head rectifier, respectively, and were described above in FIG. 2B. The rectifying state properties of each of these rectifiers depend on the distribution of dopants within the active region 102.

The plots 220-223 of the I-V characteristic curves reveal the response of the device 100 to different operating voltage polarities and magnitudes. In particular, plot 220 reveals that when the device 100 is Configured as the forward rectifier 211, current flows from the first electrode 104 to the second electrode 106 for positive polarity voltages exceeding a voltage 224 and resistance is large for negative polarity voltages. Plot 221 reveals that when the device 100 is configured as the reverse rectifier 212, current flows from the second electrode 106 to the first electrode 104 for negative polarity voltages exceeding a voltage 225 and resistance is large for positive polarity voltages. Plot 222 reveals that when the device 100 is configured as the shunted rectifier 213, current substantially flows undisturbed through the device 100 for positive and negative polarity voltages with magnitudes exceeding voltages 226 and 227. Finally, plot 223 reveals that when the device 100 is configured as a head-to-head rectifier 214, the resistance of the device 100 is high for positive and negative polarity voltages between voltages 228 and 229. Note that plots 220-223 show only operating voltage ranges. In other words, the magnitudes of voltages applied to the rectifiers 211-214 represented in plots 220-223 are not large enough to change the rectifier to a different rectifier or destroy the device 100.

The dopants are mobile under an appropriate drift field because the active region 102 may only be a few nanometers thick. The reconfiguration of the dopant profiles due to the drift of dopants under a drift field leads to electrical switching between the four rectifiers. As shown in FIG. 2C, shunting is switching between the forward rectifier 211 and the shunted rectifier 213. In this switching, interface 230 is heavily doped and remains Ohmic-like with negligible changes during the electrical biasing. A bias with an appropriate polarity and magnitude on the first electrode 104 attracts a portion of the dopants to the interface 232, switching the device from the forward rectifier 211 to the shunted rectifier 213. A bias with an opposite polarity and approximately the same magnitude switches the shunted rectifier 213 back to the forward rectifier 211. Of course, the switching between the reverse rectifier 212 and the shunted rectifier 213 also belongs to this type of switching, indicated by diagonal arrow 234.

Opening is switching between the reverse rectifier 212 and the head-to-head rectifier 214. In this case, the undoped interface 230 remains unchanged and only the doped interface 232 is switched. The undoped interface contains few dopants and remains rectifying instead of Ohmic-like. A bias of an appropriate polarity and magnitude on the first electrode 104 forces dopants away from the interface 232 and switches the reverse rectifier 212 into the head-to-head rectifier 214, and vice versa. The switching between the forward rectifier 211 and the back-to-back rectifier 214 is also opening.

Inverting between the forward rectifier 211 and the reverse rectifier 212 involves simultaneously applying oppositely polarized biases to the electrodes 104 and 106. For example, switching from the forward rectifier 211 to the reverse rectifier 212 is accomplished by applying oppositely polarized biases to the electrodes 104 and 106 to force dopants away from the interface 230 and attract dopants to the interface 232. Switching from the reverse rectifier 212 to the forward rectifier 211 is accomplished by applying oppositely polarized biases to the electrodes 104 and 106 to force dopants away from the interface 232 and attract dopants to the interface 230. Therefore, the dopant profile across the active region 102 is essentially inverted and so is the rectifying orientation, resulting in a switching between a reverse rectifier and a forward rectifier.

III. Device Composition and Operation

The material of the primary active layer can be composed of an oxide having at least one oxygen atom ("O") and at least one other element. In particular, the primary active layer can be composed of any of titania ("$TiO_2$"), zirconia ("$ZrO_2$"), and hafnia ("$HfO_2$"). These materials are compatible with silicon ("Si") integrated circuit technology because they do not create deep level dopants in Si. Other composition embodiments for the active region 102 include alloys of these oxides in pairs or with all three of the elements Ti, Zr, and Hf present. For example, the primary active layer can be composed of $Ti_xZr_yHf_zO_2$, where x+y+z=1. Related compounds include titanates, zirconates, and hafnates. For example, titanates includes $ATiO_3$, where A represents one of the divalent elements strontium ("Sr"), barium ("Ba") calcium ("Ca"), magnesium ("Mg"), zinc ("Zn"), and cadmium ("Cd"). In general, the primary active layer can be composed of $ABO_3$, where A represents a divalent element and B represents Ti, Zr, and Hf. The primary active layer can also be composed of alloys of these various compounds, such as $Ca_aSr_bBa_cTi_xZr_yHf_zO_3$, where a+b+c=1 and x+y+z=1. There are also a large variety of other oxides of the transition and rare earth metals with different valences that may be used, both individually and as more complex compounds. In each case, the mobile dopant is an oxygen vacancy. An oxygen vacancy effectively acts as a positively charged n-type dopant with one shallow and one deep energy level. For example, because even a relatively minor nonstoichiometry of about 0.1% oxygen vacancies in $TiO_{2-x}$ is approximately equivalent to $5 \times 10^{19}$ dopants/cm$^3$, modulating oxygen vacancy profiles have strong effect on electron transport.

In other embodiments, the primary active layer can be composed of a nitride having at least one nitrogen atom and at least one other element. For example, the primary active layer can be composed of, but is not limited to, $Si_3N_4$, $Be_3N_2$, $P_3N_5$, TlN, $Li_3N$, AlN and a large variety of other nitrides. The mobile dopant can be a nitrogen vacancy.

In other embodiments, the primary active layer can be composed of a sulfide having at least one sulfur atom and at least one other element. For example, the primary active layer can be composed of, but is not limited to, CdS, PbS, ZnS, $CS_2$, and a large variety of other sulfides. The mobile dopant can be a sulfur vacancy.

In other embodiments, the primary active layer can be composed of a carbide having at least one C atom and at least one other element. For example, the primary active layer can be composed of, but is not limited to, $Na_2C_2$, $CaC_2$, $LaC_2$, $Li_4C_3$, $Mg_2C_3$, $B_4C$, SiC, and a large variety of other carbides. The mobile dopant can be a carbon vacancy.

The electrodes 104 and 106 can be composed of platinum, gold, copper, tungsten or any other suitable metal, metallic compound (e.g. some perovskites such as $BaTiO_3$ and $Ba_{1-x}La_xTiO_3$. $PrCaMnO_3$) or semiconductor.

Note that in the following description "M" represents one of the following materials: Ti, Hf, Zr, $Ti_xZr_yHf_z$ATi, AB, and $Ca_aSr_bBa_cTi_xZr_yHf_z$ described above, and any other non-oxygen portion of an oxide, any non-nitrogen portion of a nitride, any non-sulfur portion of a sulfide, or any non-carbon portion of a carbide. Also, the letter "V" represents a vacancy, such as an oxygen vacancy, a nitrogen vacancy, a sulfur vacancy, or carbon vacancy.

FIG. 3 shows the composition of layers traditionally employed in forming the primary and secondary active regions of an active region of a memristor device 300. The device 300 comprises a first electrode 301 deposited on a primary active layer 302 which is deposited on a second electrode 303. The second electrode 303 is deposited on an M-layer 304 comprising a material M. The M-layer 304 is deposited on an insulation layer 305, such as $SiO_2$, which is deposited on a silicon layer 306. For the sake of illustration, the granular structure of the second electrode 303 is represented. Ideally the grains of the second electrode 303 are small enough for the material M to thermally diffuse through the second electrode 303 along the grain boundaries to an interface 308 between the primary active layer 302 and the second electrode 303, as indicated by directional arrows 310-313. In certain embodiments, the material can diffuse a short distance into the primary active layer 302. The material M located along the interface 308 reacts with the oxide creating a relatively high concentration of vacancies V in a region 314 near the second electrode 303. The region 314 corresponds to the secondary active layer of an active region 318.

However, in practice, the grains comprising the second electrode 303 may vary in size, and in many cases, the size of the grains may be large enough to prevent a sufficient amount of the material M from thermally diffusing into the interface 308. FIG. 4 shows enlarged grains comprising a second electrode 402 of a memristor device 400, where the grains of the second electrode 402 prevent a sufficient amount of the material M from reaching the interface 308. As a result, only a small fraction of the vacancies needed to create a secondary active layer actually forms near the interface 308, the secondary active layer fails to fully form, and the device 400 is rendered inoperable.

Figure 5A:
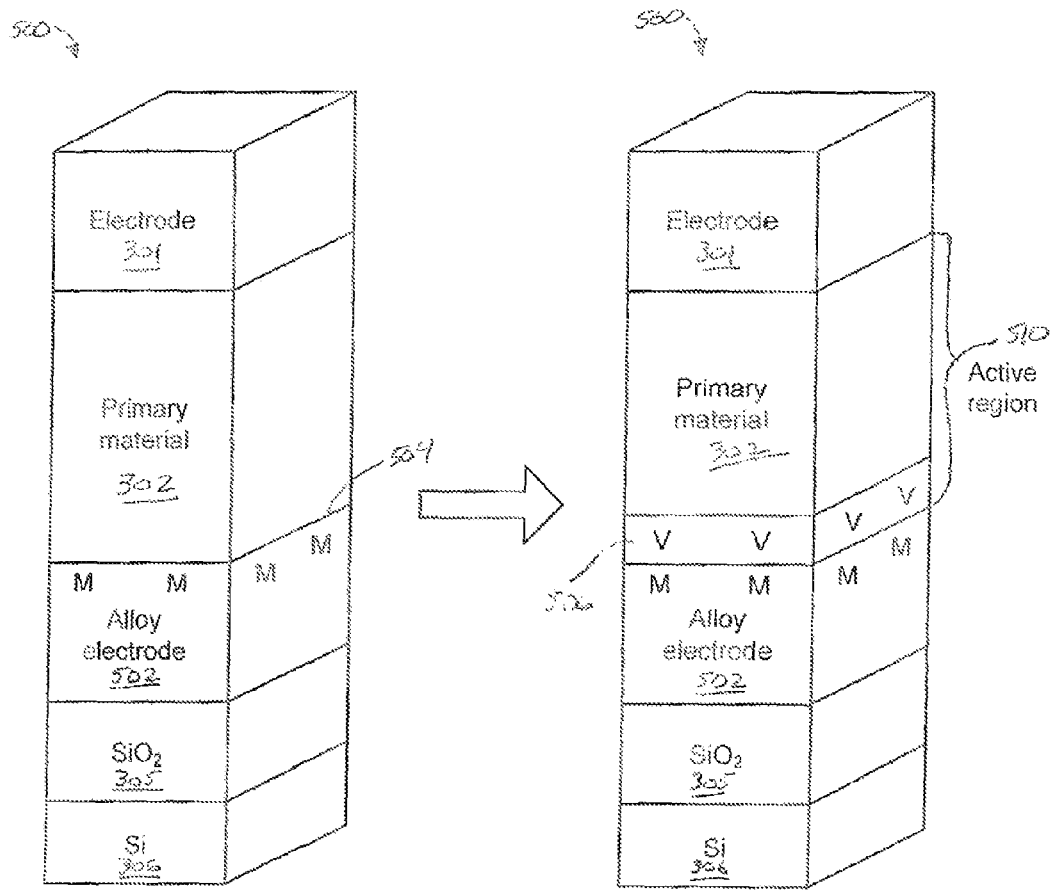
FIG. 5A shows a first memristor device configured in accordance with embodiments of the present invention.

Embodiments of the present invention include incorporating the material M into one of the electrodes to form an alloy electrode enabling the formation of high concentration of vacancies in a controllable lateral distribution within a region near the alloy electrode and primary active layer interface. FIG. 5A shows a memristor device 500 configured in accordance with embodiments of the present invention. The device 500 is similar to the device 300 except the device 500 includes a second alloy electrode 502 comprising a metal, such as Pt, Cu or Au, or a suitable semiconductor and the material M and no M-layer 304. The alloy electrode 502 can be formed by co-deposition of the metal and the material M so that the material M is distributed throughout the alloy electrode 502. After the primary active layer 302 is deposited, the material M located within the alloy electrode 502 at the interface 504 reacts with the oxide comprising the primary active layer 302 creating a relatively high concentration of vacancies within a region 506 adjacent to the alloy electrode 502. The region 506 corresponds to the secondary active layer of an active region 510. The vacancies can then be distributed to form various rectifiers as described above with reference to FIG. 2.

Figure 5B:
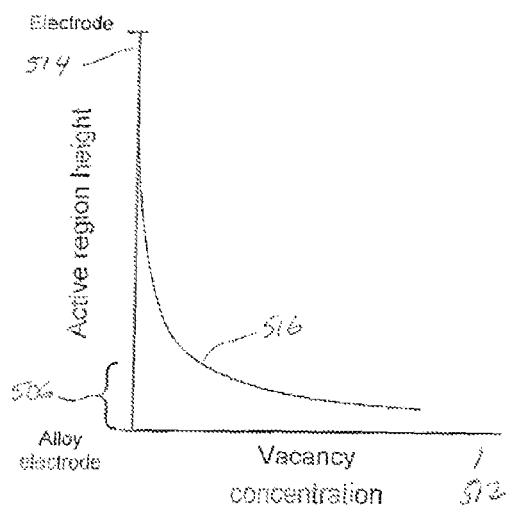
FIG. 5B shows a plot of oxygen vacancy concentration within an active region of the device shown in FIG. 5A in accordance with embodiments of the present invention.

FIG. 5B shows a plot of vacancy concentration across the active region 510 between the first and second electrodes 301 and 502 in accordance with embodiments of the present invention. Axis 512 represents the concentration of vacancies V and axis 514 represents the height of the active region 510 between the first electrode 301 and the alloy electrode 502. Curve 516 represents the concentration of vacancies between the electrodes 301 and 502 associated with the active region 510 shown in FIG. 5. Curve 516 reveals a relatively high concentration of vacancies produced near the alloy electrode 502 forming the region 506. Curve 516 also reveals that the concentration of vacancies rapidly decreases away from the region 506.

Embodiments of the present invention are not limited to incorporating the material M into the second alloy electrode 502. FIG. 6A shows a memristor device 600 configured in accordance with embodiments of the present invention. The device 600 is analogous to the device 500 except the device 600 includes a first alloy electrode 602. The alloy electrode 602 can be formed by co-deposition of the metal and the material M so that the material M is distributed throughout the alloy electrode 602. After the alloy electrode 602 is deposited, the material M located at an interface 604 reacts with the oxide of primary active layer 302 creating a relatively high concentration of vacancies within a region 606 adjacent to the alloy electrode 602. The region 606 corresponds to the secondary active layer of an active region 610.

In other embodiments, both electrodes can be alloy electrodes. FIG. 6B shows a memristor device 650 configured in accordance with embodiments of the present invention. The device 650 is analogous to the devices 500 and 600 except the device 650 includes a first alloy electrode 602 and a second alloy electrode 502 formed as described above with reference to FIGS. 5A and 6A. The alloy electrodes 502 and 602 lead to the formation of two vacancy regions 506 and 606 near the interfaces 504 and 604, respectively, the two regions 506 and 606 corresponding two secondary active regions sandwiching an primary active region 652.

The alloy electrode is not limited to incorporating a single material M with a metal or semiconductor. In other embodiments, the alloy electrode can include two or more materials that form a vacancy region corresponding to a second active layer. For example, when the primary active layer is composed of $TiO_2$, the alloy electrode can be composed of Pt and two or three elements selected from Ti, Hf, and Zn to form a $TiO_{2-x}$ layer at the interface between the alloy electrode and the oxide-based primary active layer.

In other embodiments, the material M located adjacent to the primary active layer 302 and alloy electrode interface can diffuse into the primary active layer and serve as the dopant.

In other embodiments, the primary active layer 302 can be a semiconducting nitride or a semiconducting halide. For example, semiconducting nitrides include AlN, GaN, ScN, YN, LaN, rare earth nitrides, and alloys of these compounds and more complex mixed metal nitrides, and semiconducting halides include CuCl, CuBr, and AgCl. The active region can be a phosphide or an arsenide of various transition and rare earth metals. In all of these compounds, the mobile dopant can be an anion vacancy or an aliovalent element.

In other embodiments, the primary active layer 302 can also be composed of a semiconductor material including various combinations of direct and indirect semiconductors. The indirect and direct semiconductors can be elemental and compound semiconductors. Indirect elemental semiconductors include Si and germanium (Ge), and compound semiconductors include III-V materials, where Roman numerals III and V represent elements in the IIIa and Va columns of the Periodic Table of the Elements. Compound semiconductors can be composed of column IIa elements, such as aluminum (Al), gallium (Ga), and indium (In), in combination with column Va elements, such as nitrogen (N), phosphorus (P), arsenic (As), and antimony (Sb). Compound semiconductors can also be further classified according to the relative quantities of III and V elements. For example, binary semiconductor compounds include semiconductors with empirical formulas GaAs, InP, InAs, and GaP; ternary compound semiconductors include semiconductors with empirical formula $GaAs_yP_{1-y}$, where y ranges from greater than 0 to less than 1; and quaternary compound semiconductors include semiconductors with empirical formula $In_xGa_{1-x}As_yP_{1-y}$, where both x and y independently range from greater than 0 to less than 1. Other types of suitable compound semiconductors include II-VI materials, where II and VI represent elements in the IIb and VIa columns of the periodic table. For example, CdSe, ZnSe, ZnS, and ZnO are empirical formulas of exemplary binary II-VI compound semiconductors. Other II-VI semiconductor materials can be used.

The mobile dopants in a semiconductor-based primary active layer 302 can be p-type impurities, which are atoms that introduce vacant electronic energy levels called "holes" to the electronic band gaps of the active region. These dopants are also called "electron acceptors." The mobile dopants can be n-type impurities, which are atoms that introduce filled electronic energy levels to the electronic band gap of the active region. These dopants are called "electron donors." For example, boron (B), Al, and Ga are p-type dopants that introduce vacant electronic energy levels near the valence band of Si; and P, As, and Sb are n-type dopants that introduce filled electronic energy levels near the conduction band of Si. In III-V compound semiconductors, column VI dopants substitute for column V sites in the III-V lattice and serve as n-type dopants, and column II dopants substitute for column III atoms in the III-V lattice to form p-type dopants.

Figure 7:
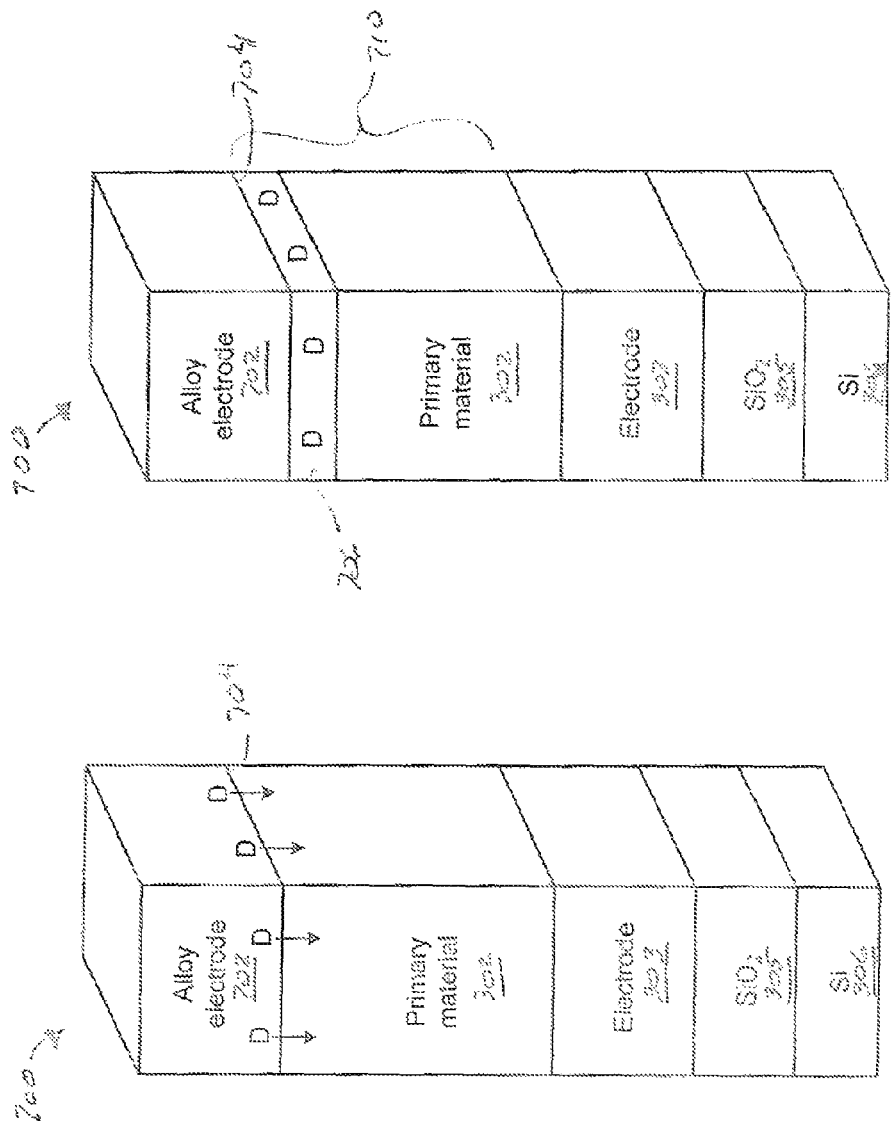
FIG. 7 shows a fourth memristor device configured in accordance with embodiments of the present invention.

FIG. 7 shows a memristor device 700 configured in accordance with embodiments of the present invention. The device 700 is analogous to the device 500 except the device 700 includes a first alloy electrode 702. In these embodiments, the primary active layer 302 is composed of a semiconductor, and the alloy electrode 702 can be formed by co-deposition of the metal and a semiconductor dopant denoted by "D." The dopant can have concentrations in excess of about $10^{15}$ dopants/cm$^3$ while more heavy doping of the alloy electrode 702 can have dopant concentrations in excess of about $10^{19}$ dopants/cm$^3$. After the alloy electrode 702 is deposited, the dopants located near interface 704 diffuse a short distance into the primary active layer 302 creating a relatively high concentration of dopants within a region 706 adjacent to the alloy electrode 702. The region 706 corresponds to the secondary active layer of an active region 710.

IV. Nanowire Implementations

Figure 8:
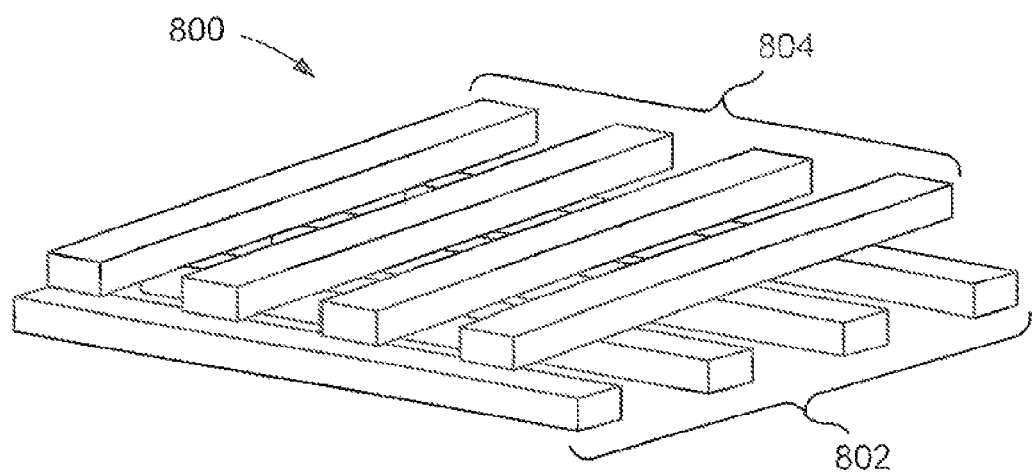
FIG. 8 shows an isometric view of a nanowire crossbar array configured in accordance with embodiments of the present invention.

The memristor devices 500, 600, 650, and 700 can be implemented at nanowire intersections of nanowire crossbar arrays. FIG. 8 shows an isometric view of a nanowire crossbar array 800 configured in accordance with embodiments of the present invention. The crossbar array 800 is composed of a first layer of approximately parallel nanowires 802 that are overlain by a second layer of approximately parallel nanowires 804. The nanowires of the second layer 804 are approximately perpendicular, in orientation, to the nanowires of the first layer 802, although the orientation angle between the layers may vary. The two layers of nanowires form a lattice, or crossbar, each nanowire of the second layer 804 overlying all of the nanowires of the first layer 802 and coming into close contact with each nanowire of the first layer 802 at nanowire intersections that represent the closest contact between two nanowires.

Although individual nanowires in FIG. 8 are shown with rectangular cross sections, nanowires can also have square, circular, elliptical, or more complex cross sections. The nanowires may also have many different widths or diameters and aspect ratios or eccentricities. The term "nanowire crossbar" may refer to crossbars having one or more layers of sub-microscale wires, microscale wires, or wires with larger dimensions, in addition to nanowires.

The layers can be fabricated by mechanical nanoimprinting techniques, photolithography, and electron beam lithography. Alternatively, nanowires can be chemically synthesized and can be deposited as layers of approximately parallel nanowires in one or more processing steps, including Langmuir-Blodgett processes. Other alternative techniques for fabricating nanowires may also be employed. Thus, a two-layer nanowire crossbar comprising first and second layers, as shown in FIG. 8, can be manufactured by any of numerous relatively straightforward processes. Many different types of conductive and semi-conductive nanowires can be chemically synthesized from metallic and semiconductor substances, from combinations of these types of substances, and from other types of substances. A nanowire crossbar may be connected to microscale address-wire leads or other electronic leads, through a variety of different methods in order to incorporate the nanowires into electrical circuits. At nanowire intersections, nanoscale electronic components, such as resistors, and other familiar basic electronic components, can be fabricated to interconnect two overlapping nanowires. Any two nanowires connected by a device is called a "crossbar junction."

Figure 9:
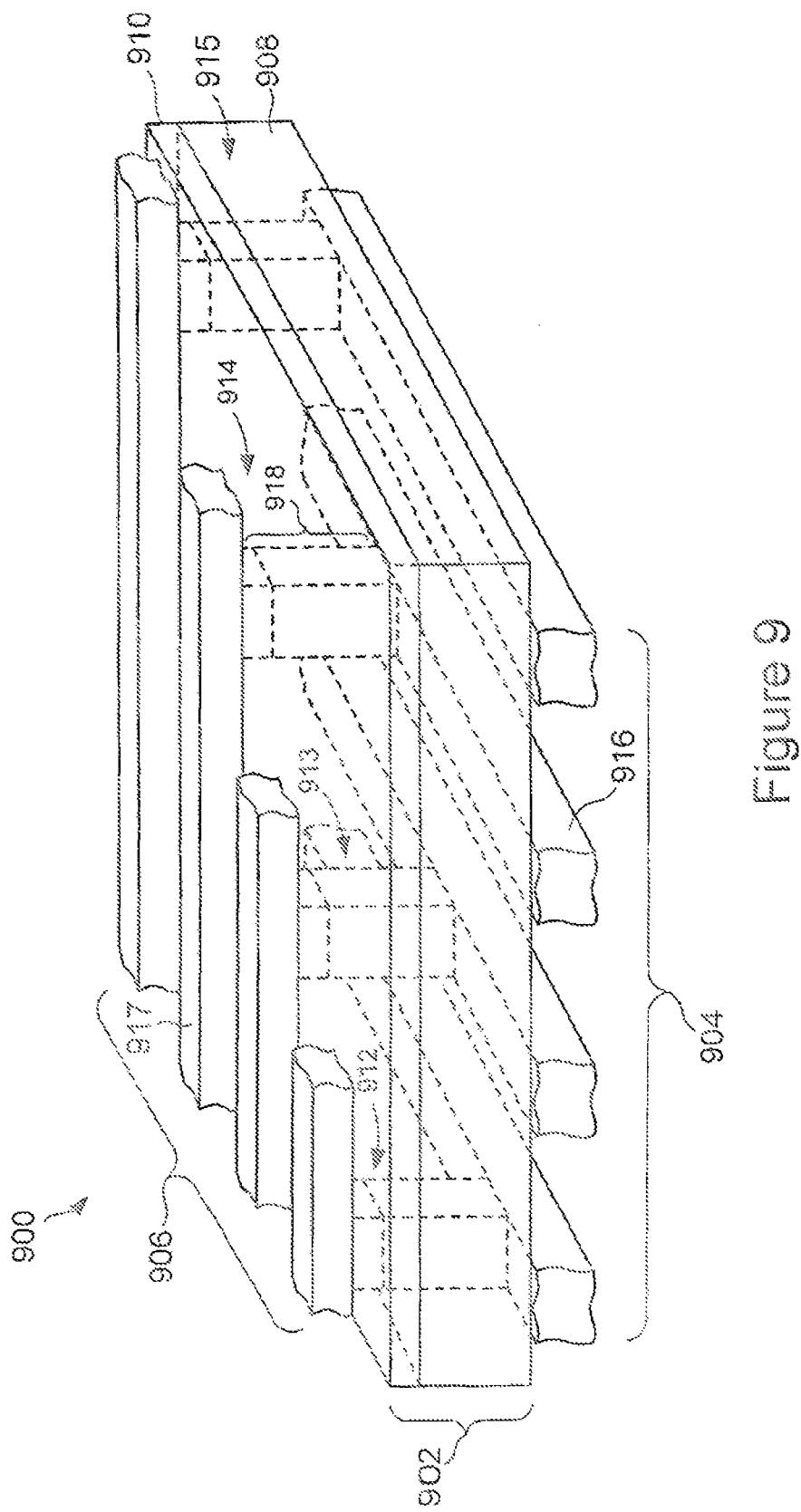
FIG. 9 shows an isometric view of a nanowire crossbar revealing devices located at intersection of a crossbar configured in accordance with embodiments of the present invention.

FIG. 9 shows an isometric view of a nanowire crossbar 900 revealing an intermediate layer 902 deposited between a first layer of approximately parallel nanowires 904 and a second layer of approximately parallel nanowires 906 in accordance with embodiments of the present invention. The layer 902 is composed of sub-layers 908 and 910. The sub-layer 908 can be composed of an undoped primary active material, and the sub-layer 910 can be composed of a doped secondary active material. The material comprising the layer 902 and dopants are selected as described in subsection III to form devices 912-915 at each nanowire intersection. The nanowires can be composed of suitable metal of semiconductor materials and serve as electrodes. For example, sub-layer 908 can be composed of $TiO_2$, the nanowires in the layer 904 can be composed of Pt, the nanowires 906 can be composed of a Ti and Pt alloy, and a relatively thinner sub-layer 910 composed of $TiO_{2-x}$, where dopants in the sub-layer 910 may be formed as described above with reference to FIGS. 5A, 5B, and 6A. In other embodiments, the nanowires 904 and 906 can be composed of a Ti and Pt alloy, as described above with reference to FIG. 6B. The device 914 is formed by a nanowire 916 in the first layer 904, a nanowire 917 in the second layer 906, and a region 918 within the layer 902 between the nanowires 916 and 917. Each of the devices 912-915 can be operated separately to produce the forward, reverse, shunted, and head-to-head rectifiers described above with reference to FIG. 2.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purposes of illustration and description. They are not intended to be exhaustive of or to limit the invention to the precise forms disclosed. Obviously, many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

The invention claimed is:

1. A device comprising:
    an electrode;
    an alloy electrode; and
    an active region sandwiched between the electrode and the alloy electrode, the alloy electrode forms dopants in a sub-region of the active region adjacent to the alloy electrode such that the dopant can be selectively positioned within the active region to control the flow of charge carriers between the electrode and the alloy electrode, the active region comprising:
        a primary active layer comprising a material for transporting the dopant that controls the flow of charge carriers through the device; and a secondary active layer comprising the sub-region and providing one of a source and a sink of the dopants for the primary active region, wherein the secondary active layer comprises the material of the primary active layer that has reacted with the alloy electrode.

2. The device of claim 1 wherein the alloy electrode causes the secondary active layer to form adjacent to the alloy electrode and the primary active layer to form within the active region adjacent to the electrode.

3. The device of claim 1 wherein the dopant further comprises one of: an oxygen vacancy, a nitrogen vacancy, a sulfur vacancy, a carbon vacancy, an anion vacancy, aliovalent element, a p-type impurity, and an n-type impurity.

4. The device of claim 1 wherein the primary active layer further comprises a material that is electronically semiconducting, nominally electronically insulating, or weakly ionic conducting.

5. The device of claim 1 wherein the primary active layer further comprises a film having an electrical conductivity that is capable of being reversibly changed from a relatively low conductivity to a relatively high conductivity as a function of the dopants drifting into or out of the at least one primary active region.

6. The device of claim 1 wherein the material for the primary active layer and the material for the secondary active layer are selected from the group consisting of titanates, zirconates, hafnates, lanthanates, manganites, other suitable alloys of these oxides in pairs or with oxides present together, and compounds of the type $A^{++}B^{4+}O_3^{--}$, where A represents at least one divalent element and B represents at least one of titanium, zirconium, and hafnium.

7. The device of claim 1 wherein the material for the primary active layer and secondary active region can be a semiconducting nitride, a semiconducting halide, an elemental semiconductor, or a compound semiconductor.

8. The device of claim 1 the material for the primary active layer and secondary active layer can be a nitride, sulfide, phosphide or a carbide.

9. The device of claim 1 wherein positioning the dopant further comprises positioning the dopant near an electrode/active region interface making the interface Ohmic-like and positioning the dopant away from an electrode/active region interface making the interface Schottky-like.

10. The device of claim 1 wherein the electrode further comprises a second alloy electrode such that the second alloy electrode forms dopants in a second sub-region of the active region adjacent to the second alloy electrode.

11. The device of claim 1 wherein the alloy electrode further comprises a metal or semiconductor and at least one material that forms vacancies in the active region or a semiconductor dopant that diffuses into the active region.

12. A nanowire crossbar comprising:
a first layer of substantially parallel nanowires;
a second layer of substantially parallel nanowires overlaying the first layer of nanowires; and
at least one nanowire intersection forming an electronic device configured in accordance with claim 1.

13. The crossbar of claim 12 wherein the first layer of nanowires further comprise a metal or a semiconductor and the second layer of nanowires further comprise an alloy.

14. The crossbar of claim 13 wherein any two overlapping nanowires in the first and second layers form an electronic device configured in accordance with claim 1.

15. A nanowire crossbar comprising:
a first layer of substantially parallel nanowires;
a second layer of substantially parallel nanowires overlaying the first layer of nanowires; and
a nanowire intersection forming an electronic device comprising:
an electrode;
an alloy electrode; and
an active region sandwiched between the electrode and the alloy electrode, the active region comprising:
a primary active layer comprising a material for transporting dopants that controls the flow of charge carriers through the device; and
a secondary active layer configured to provide one of a source and a sink of the dopants for the primary active region, wherein the secondary active layer comprises the material of the primary active layer that has reacted with the alloy electrode;
wherein a voltage applied to the electrode and the alloy electrode induces a controllable flow of charge carries via the dopants between electrode and the alloy electrode.

16. The device of claim 15, wherein the primary active layer further comprises a film having an electrical conductivity configured to be reversibly changed from a relatively low conductivity to a relatively high conductivity as a function of the dopants drifting into or out of the primary active layer of the active region.

17. The device of claim 15, wherein the electrode further comprises a second alloy electrode, wherein the active region comprises a tertiary active layer configured to provide one of a source and a sink of the dopants for the primary active region, wherein the third active layer comprises the material of the primary active layer that has reacted with the second alloy electrode.

18. The crossbar of claim 15, wherein the first layer of nanowires further comprises a metal or a semiconductor and the second layer of nanowires further comprises an alloy.

* * * * *